US011387749B2

(12) United States Patent
Anai

(10) Patent No.: US 11,387,749 B2
(45) Date of Patent: Jul. 12, 2022

(54) VIBRATION ENERGY HARVESTER

(71) Applicant: Saginomiya Seisakusho, Inc., Tokyo (JP)

(72) Inventor: Daisuke Anai, Sayama (JP)

(73) Assignee: Saginomiya Seisakusho, Inc., Tokyo (JP)

( * ) Notice: Subject to any disclaimer, the term of this patent is extended or adjusted under 35 U.S.C. 154(b) by 376 days.

(21) Appl. No.: 16/599,735

(22) Filed: Oct. 11, 2019

(65) Prior Publication Data

US 2020/0119662 A1 Apr. 16, 2020

(30) Foreign Application Priority Data

Oct. 15, 2018 (JP) .............................. JP2018-194438

(51) Int. Cl.
*H02N 2/18* (2006.01)
*H02N 2/00* (2006.01)

(52) U.S. Cl.
CPC ........... *H02N 2/188* (2013.01); *H02N 2/0055* (2013.01); *H02N 2/183* (2013.01)

(58) Field of Classification Search
CPC ............................... H02N 2/183; H02N 2/188
See application file for complete search history.

(56) References Cited

U.S. PATENT DOCUMENTS

| 2001/0002551 | A1* | 6/2001 | Kawai | ................. | G01P 15/0802 73/504.12 |
| 2004/0081391 | A1* | 4/2004 | Ko | ..................... | G02B 26/0841 385/18 |
| 2010/0050767 | A1 | 3/2010 | Higuchi et al. | | |
| 2014/0065318 | A1 | 3/2014 | Suzuki et al. | | |
| 2018/0245919 | A1* | 8/2018 | Yoshida | ............. | G01C 19/5783 |
| 2019/0058420 | A1 | 2/2019 | Toshiyoshi et al. | | |
| 2021/0119555 | A1 | 4/2021 | Toshiyoshi et al. | | |
| 2021/0218349 | A1* | 7/2021 | Toshiyoshi | ............... | B81B 3/00 |
| 2021/0331913 | A1* | 10/2021 | Ashizawa | ............ | B81B 3/0089 |

FOREIGN PATENT DOCUMENTS

| JP | 2004-36675 A | 2/2004 |
| JP | 2005-159619 A | 6/2005 |
| JP | 4609558 B2 | 1/2011 |
| JP | 4777806 B2 | 9/2011 |
| JP | 5627130 B2 | 11/2014 |
| JP | 2015-130794 A | 7/2015 |
| JP | 2017-70163 A | 4/2017 |
| JP | 2018-88777 A | 6/2018 |
| JP | 6338071 B2 | 6/2018 |

OTHER PUBLICATIONS

Q. Fu and Y. Suzuki, "MEMS vibration electret energy harvester with combined electrodes," 2014 IEEE 27th International Conference on Micro Electro Mechanical Systems (MEMS), 2014, pp. 409-412, doi: 10.1109/MEMSYS.2014.6765663. (Year: 2014).*
Japanese-language Office Action issued in Japanese Application No. 2018-194438 dated Jun. 29, 2021 with English translation (five (5) pages).

* cited by examiner

Primary Examiner — J. San Martin
(74) Attorney, Agent, or Firm — Crowell & Moring LLP

(57) ABSTRACT

A vibration energy harvester includes: a fixed electrode unit having a plurality of comb-tooth electrodes; a movable electrode unit having a plurality of comb-tooth electrodes; a weight fixed to the movable electrode unit; and an adjusting weight mounting structure capable of mounting an adjusting weight for additionally adjusting a mass of the weight.

12 Claims, 14 Drawing Sheets

VIBRATION DIRECTION (MOVE TO RIGHT)   (COLLISION)

(MOVE TO RIGHT)   (COLLISION)

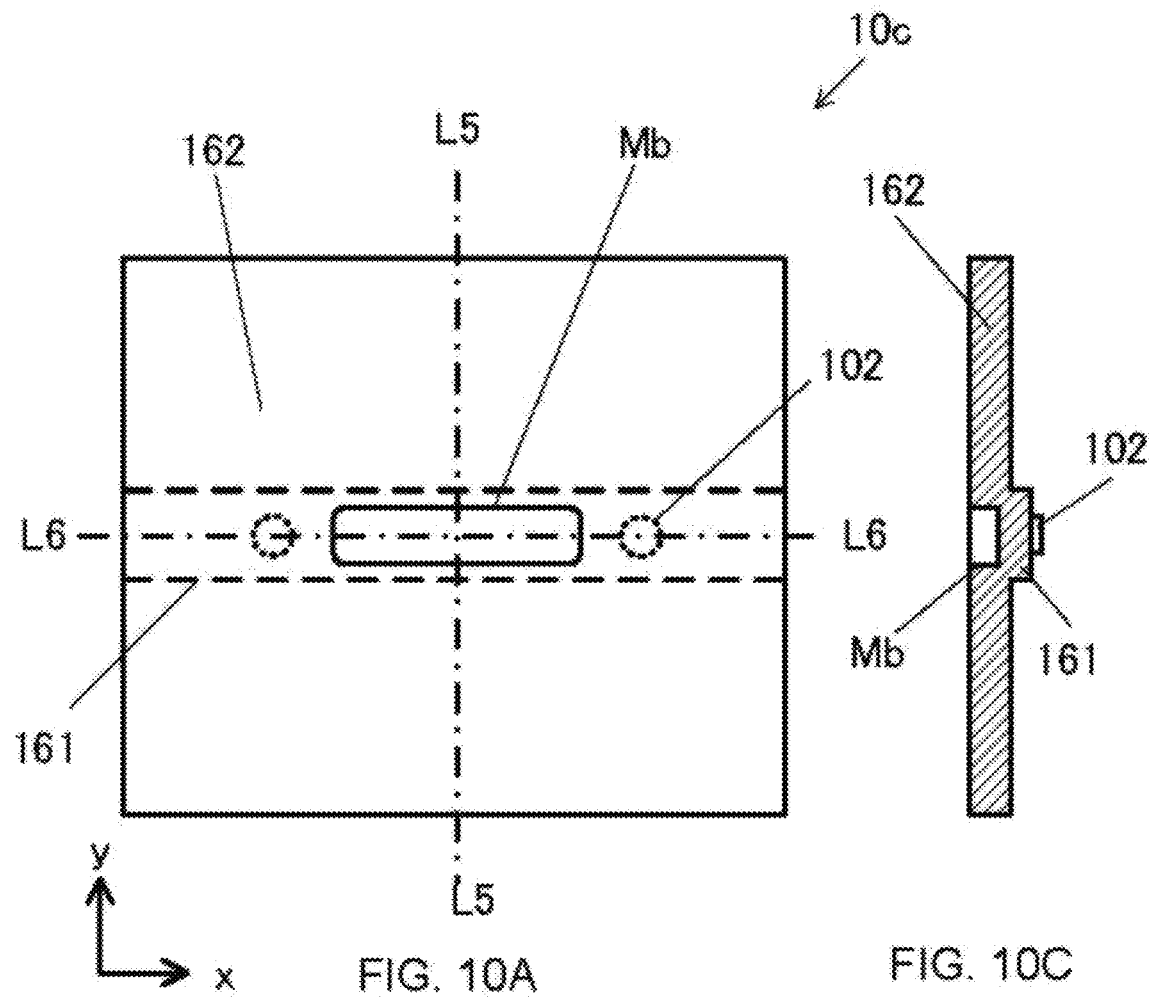
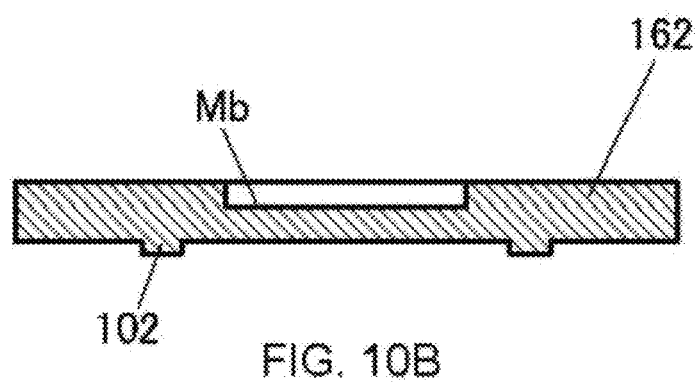

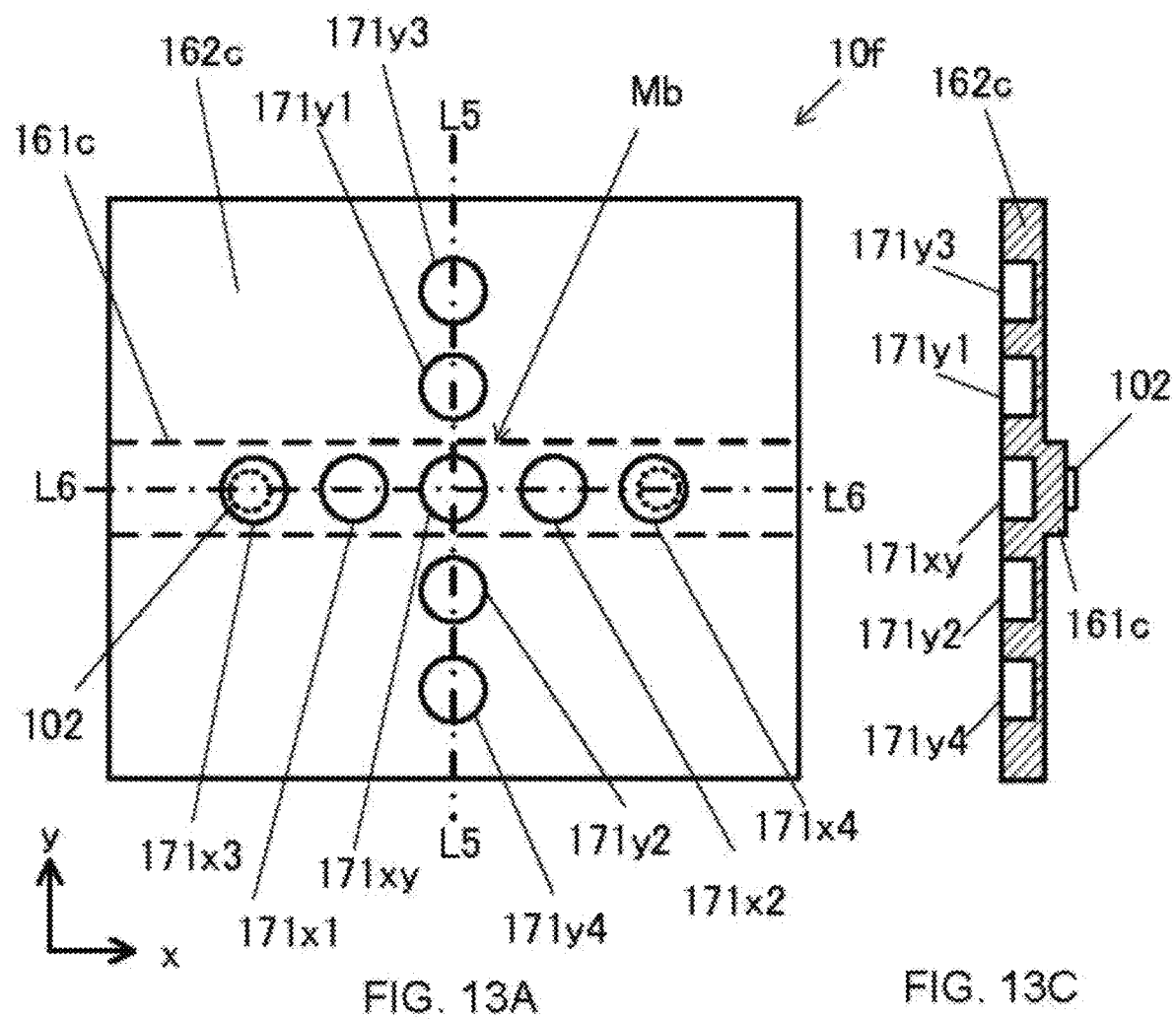
FIG. 13A
FIG. 13C
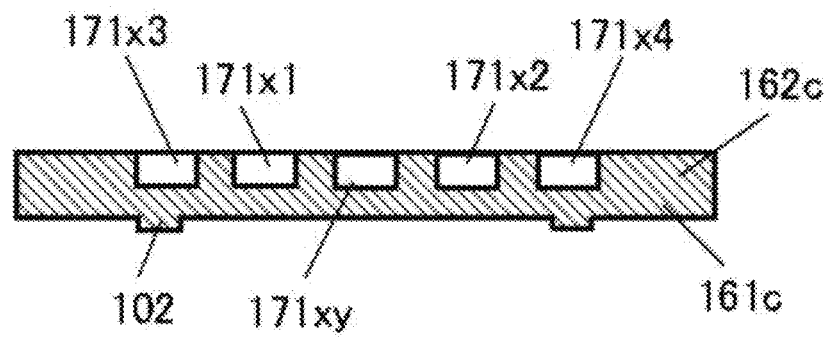
FIG. 13B

VIBRATION ENERGY HARVESTER

INCORPORATION BY REFERENCE

The disclosures of the following priority application and publications are herein incorporated by reference:
Japanese Patent Application No. 2018-194438 filed Oct. 15, 2018
Japanese Laid-Open Patent Publication No. 2017-070163
Japanese Patent No. 5627130

TECHNICAL FIELD

The present invention relates to a vibration energy harvester.

BACKGROUND ART

In recent years, very small vibration energy harvesters using MEMS technology have been developed. For example, in PTL1, electric power is generated by vibrating a movable unit having comb-tooth electrodes formed thereon with respect to a fixed unit having comb-tooth electrodes formed thereon. In such a vibration energy harvester, it is important to further increase the mass of the movable unit in order to efficiently generate electric power even with small environmental vibrations. The vibration energy harvester described in PTL1 has a structure in which a weight formed separately is attached to the movable unit.

CITATION LIST

Patent Literature

PTL1: Japanese Patent No. 6338071

SUMMARY OF INVENTION

Technical Problem

PTL1 does not disclose a configuration capable of adjusting the mass of the weight. When the mass varies from one weight to another, the resonance frequency of the vibration energy harvester varies, which results in a deterioration in the power generation efficiency of the vibration energy harvester.

Solution to Problem

According to one aspect of the present invention, a vibration energy harvester comprises: a fixed electrode unit having a plurality of comb-tooth electrodes; a movable electrode unit having a plurality of comb-tooth electrodes; a weight fixed to the movable electrode unit; and an adjusting weight mounting structure capable of mounting an adjusting weight for additionally adjusting a mass of the weight.

Advantageous Effects of Invention

According to the present invention, the mass of the weight is easily kept within a predetermined set value range.

BRIEF DESCRIPTION OF DRAWINGS

FIG. 5 is an exploded view of the movable electrode unit and the weight shown in FIGS. 1A and 1B. FIG. 5 shows the movable electrode unit as viewed from above and the weight as viewed from below in a perspective view.

FIGS. 10A to 10C show a first modification of the weight. FIG. 10A is a plan view of the weight, FIG. 10B is a cross-sectional view taken along a center line L6-L6 of FIG. 10A, and FIG. 10C is a cross-sectional view taken along a center line L5-L5 of FIG. 10A.

FIG. 11A is a plan view of the weight, FIG. 11B is a cross-sectional view taken along a center line L6-L6 of FIG. 11A, and FIG. 11C is a cross-sectional view taken along a center line L5-L5 of FIG. 11A.

FIG. 12A is a plan view of the weight, FIG. 12B is a cross-sectional view taken along a center line L6-L6 of FIG. 12A, and FIG. 12C is a cross-sectional view taken along a center line L5-L5 of FIG. 12A.

FIGS. 13A to 13C show a second embodiment of the weight. FIG. 13A is a plan view of the weight, FIG. 13B is a cross-sectional view taken along a center line L6-L6 of FIG. 13A, and FIG. 13C is a cross-sectional view taken along a center line L5-L5 of FIG. 13A.

DESCRIPTION OF EMBODIMENTS

First Embodiment

Figure 1A:
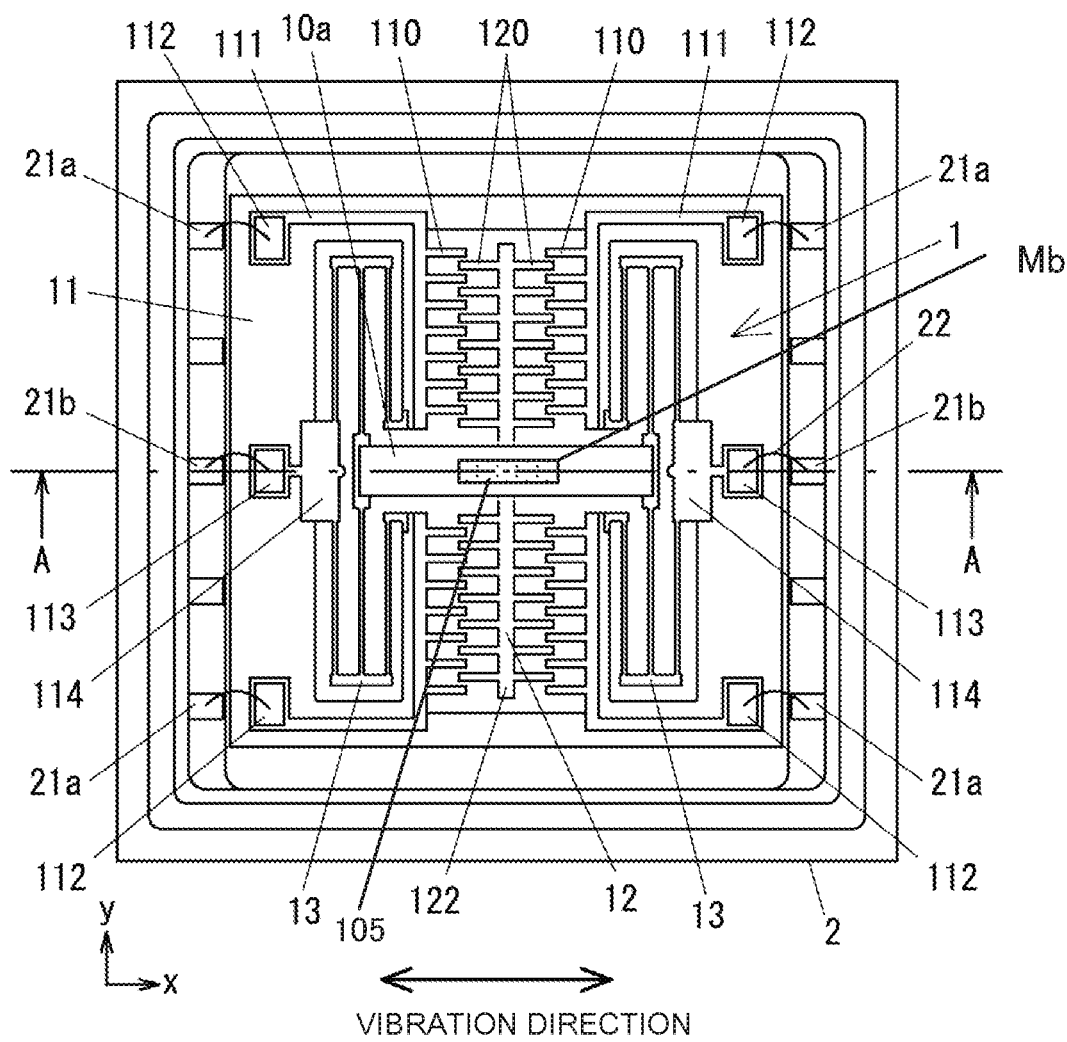
FIGS. 1A, 1B are views showing a vibration energy harvester sealed in a vacuum package.
Figure 1B:
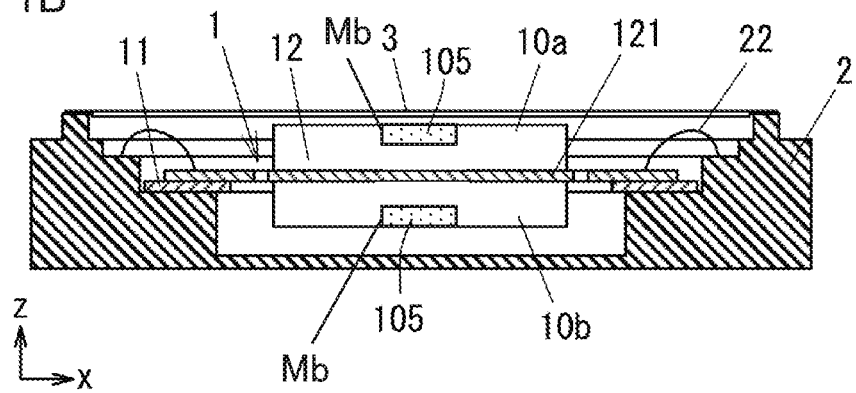

Hereinafter, embodiments for carrying out the present invention will be described with reference to the drawings. FIGS. 1A, 1B are views showing a vibration energy harvester 1 sealed in a package 2 in a vacuum state. FIG. 1A is a plan view thereof and FIG. 1B is a cross-sectional view thereof along an A-A line. Note that an upper lid 3 provided on an upper surface side (z-axis positive direction side) of the package 2 is not shown in the plan view of FIG. 1A so that an internal structure of the package 2 can be seen.

The vibration energy harvester 1 includes a fixed unit 11, a movable electrode unit 12, elastic support units 13 that elastically support the movable electrode unit 12, and a pair of weights 10a, 10b fastened to both front and rear surfaces of the movable electrode unit 12. The term "unit" above may be referred to as the term "part". The fixed unit 11 of the vibration energy harvester 1 is fixed to the package 2 by die bonding. The package 2 is made of, for example, an electrically insulating material (for example, ceramic). The upper lid 3 for sealing the inside of the package 2 in a vacuum state is seam-welded to an upper end of the package 2.

The fixed unit 11 has fixed electrode units 111 formed thereon. On each fixed electrode unit 111, a plurality of comb-tooth electrodes 110 extending in the x-axis direction are formed and arranged with each other in the y-axis direction. The movable electrode unit 12 has a plurality of comb-tooth electrodes 120 extending in the x-axis direction formed thereon and arranged with each other in the y-axis direction. Specifically, the movable electrode unit 12 includes a central strip portion 121 (see FIG. 1(b)) extending in the x-axis direction and branch portions 122 extending in the y-axis positive direction and in the y-axis negative direction, respectively, from the center of the central strip portion 121 in the x-axis direction. Generally, the center of the central strip portion 121 in the x-axis direction in the xy plane coincides with a gravity center position of the movable electrode unit 12. Each branch portion 122 of the movable electrode unit 12 has a plurality of comb-tooth electrodes 120 arranged at predetermined intervals in the y-axis direction. The plurality of comb-tooth electrodes 110 extending in the x-axis direction and the comb-tooth electrodes 120 extending from the branch portions 122 are arranged so as to engage or interdigitate with each other with a gap in the y-axis direction. The fixed electrode unit 111 has an electrode pad 112 formed thereon.

The movable electrode unit 12 is mechanically and electrically connected to connection units 114 that are formed on the fixed unit 11, via the elastic support units 13. The connection unit 114 has an electrode pad 113 formed thereon. The electrode pads 112, 113 are connected to electrodes 21a, 21b provided on the package 2 via wires 22. In the present embodiment, the movable electrode unit 12 is configured to vibrate in the x-axis direction. When the movable electrode unit 12 vibrates in the x-axis direction, an amount of insertion of the comb-tooth electrode 120 into between the comb-tooth electrodes 110 of the fixed electrode unit 111 is changed to generate electricity. Each of the weights 10a, 10b is fixed to the central strip portion 121 of the movable electrode unit 12 by adhesion or the like. In a part where each weight 10a, 10b and the central strip portion 121 of the movable electrode unit 12 are fixed to each other, an adhesive material reservoir unit that is to be filled with adhesive material may be provided to either each weight 10a, 10b or the central strip portion 121 of the movable electrode unit 12 to be fixed. The weights 10a, 10b are fixed so that their gravity center positions are located on an axis in the z direction passing through the center of the central strip portion 121 in the x-axis direction.

On a surface opposite to the movable electrode unit 12 side of each weight 10a, 10b, an adjusting weight mounting structure Mb is provided for additionally adjusting the mass of the weight. The adjusting weight mounting structure Mb will be described later.

Figure 2A:
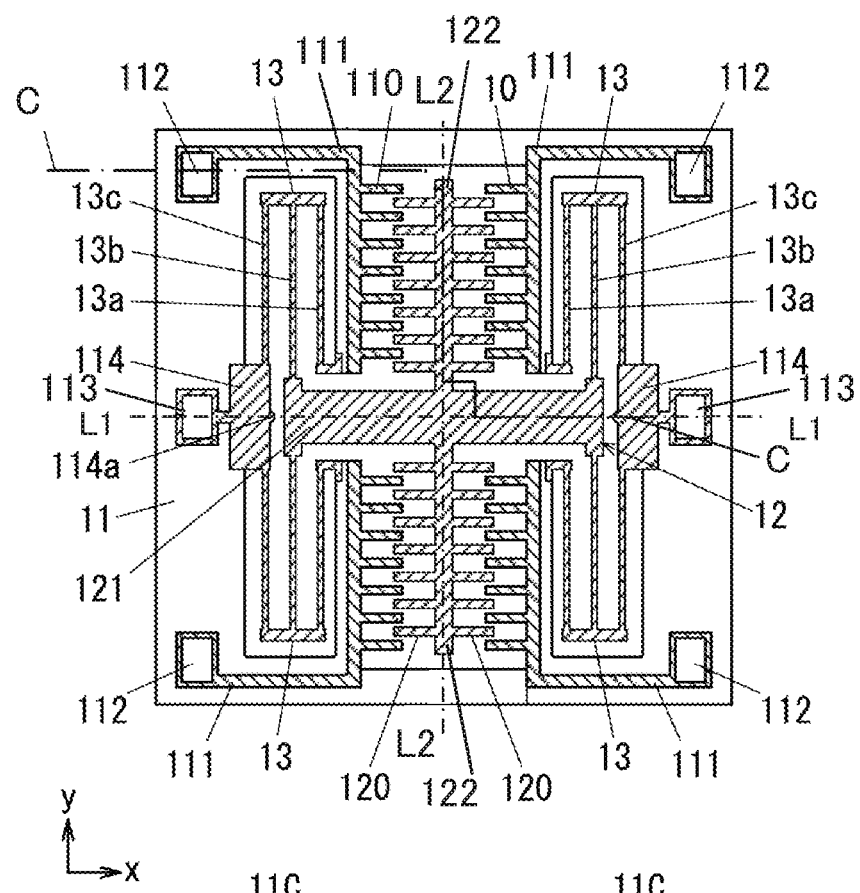
FIGS. 2A, 2B are views illustrating a configuration of units of the vibration energy harvester.
Figure 2B:
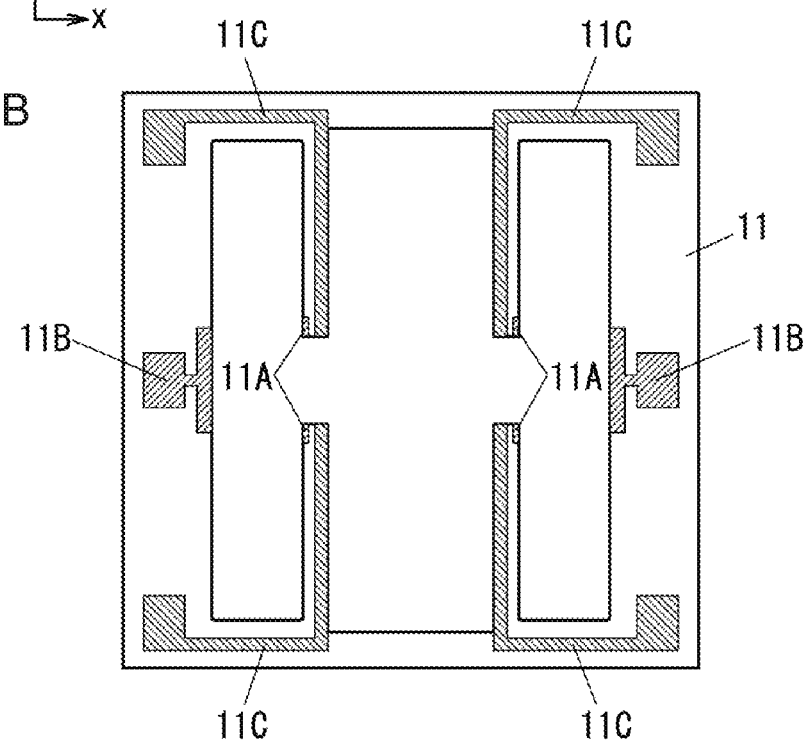

FIGS. 2A, 2B are views showing a configuration of units of the vibration energy harvester 1. As will be described later, the vibration energy harvester 1 is formed by a common MEMS processing technique using an SOI (Silicon On Insulator) substrate. The SOI substrate has a three-layer structure including a Si support layer, a SiO$_2$ box layer, and a Si active layer. The support layer constitutes the fixed unit 11 and the active layer constitutes the fixed electrode units 111, the movable electrode unit 12, the elastic support units 13, and the connection units 114.

FIG. 2A is a view showing the MEMS processed member of the vibration energy harvester 1, that is, the vibration energy harvester 1 before the weights 10a, 10b are fastened. In FIG. 2A, the fixed electrode units 111, the movable electrode unit 12, the elastic support units 13, and the connection units 114 on the fixed unit 11 are shown by hatching. The movable electrode unit 12 is elastically supported by four sets of elastic support units 13. Each elastic support unit 13 includes three beams 13a to 13c that are elastically deformable.

The connection unit 114 also serves as a limiting unit that limits a range of vibration in the x-axis direction of the movable electrode unit 12. The connection unit 114 has a protrusion 114a formed on a surface facing the movable electrode unit 12. An amplitude of vibration of the movable electrode unit 12 is limited by an end surface of the movable electrode unit 12 in the x-axis direction colliding against the protrusion 114a of the connection unit 114. Note that the protrusion may be formed on the movable electrode unit 12, although the protrusion is formed on the connection unit 114 in FIG. 2A.

FIG. 2B is a view showing only the fixed unit 11 of the vibration energy harvester 1. Hatching regions 11C shown on the fixed unit 11 in FIG. 2B indicate regions where the fixed electrode units 111 are fixed. Ends of the beams 13a are fixed on the fixed unit 11. Hatching regions 11A shown on the fixed unit 11 in FIG. 2B indicate regions where the ends of the beams 13a are fixed. End of the beams 13c are connected to connection units 114 formed on the fixed unit 11. Hatching regions 11B shown on the fixed unit 11 in FIG. 2B indicate regions where the connection unit 114 is fixed.

In the vibration energy harvester 1 in the present embodiment, separate weights 10a, 10b are attached to the movable electrode unit 12 in order to increase the mass of the movable electrode unit 12 and improve its power generation efficiency. A material having a specific gravity larger than that of the SOI substrate is used for the weights 10a, 10b so that a large mass can be obtained even with a small volume. For example, metals such as tungsten (its specific gravity of 19.25), free-cutting copper (its specific gravity of 8.94), stainless steel (its specific gravity of 7.93), and tungsten members (its specific gravity of 13 to 17) formed by metal injection, and resins mixed with metal materials such as tungsten resin (its specific gravity of 11 to 13) may be used.

Figure 3A:
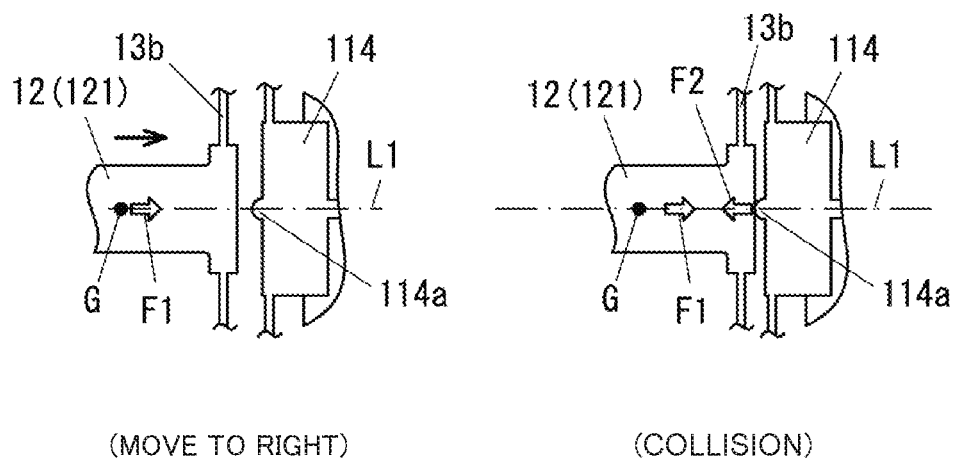
FIGS. 3A, 3B are views for explaining a displacement of the gravity center position in a vibration plane.
Figure 3B:
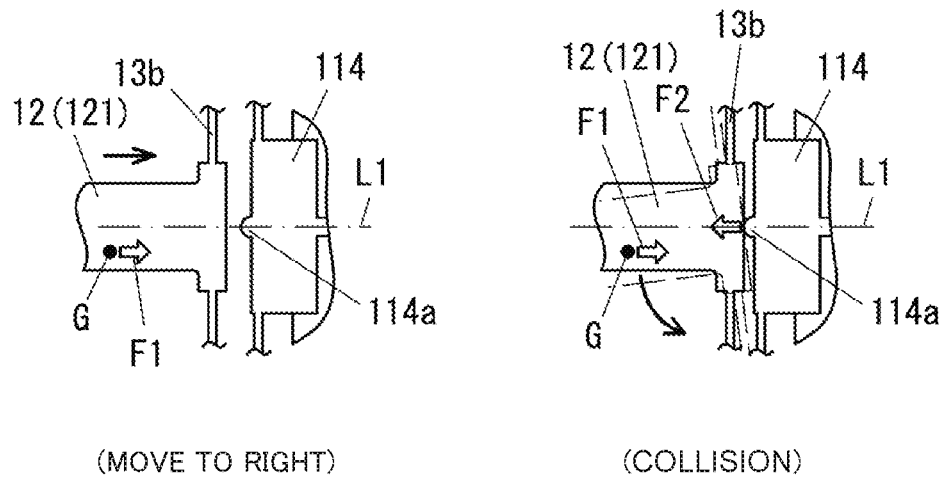
Figure 4A:
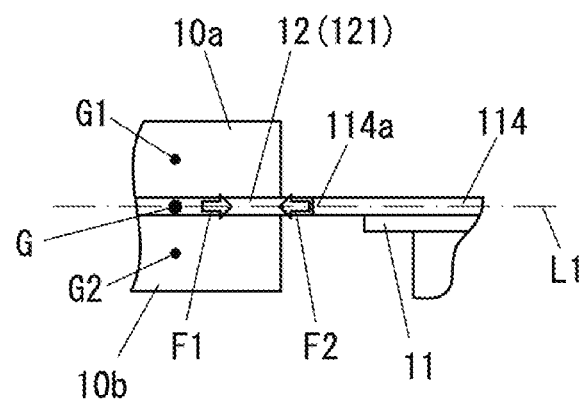
FIGS. 4A, 4B are views for explaining a displacement in a direction perpendicular to the vibration plane.
Figure 4B:
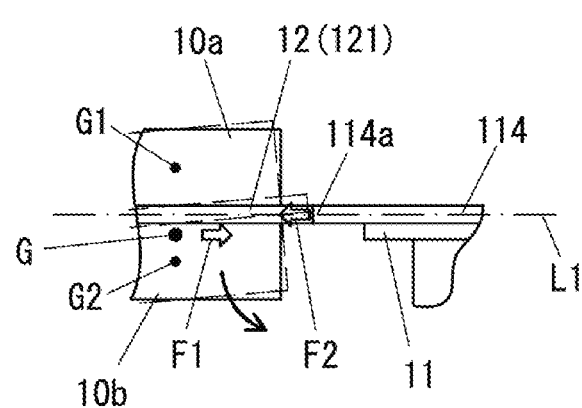

It has been found that, when the separately formed weights 10a, 10b are attached to the movable electrode unit 12 as described above, a displacement of the gravity center position of the weights 10a, 10b at the time of attachment to the movable electrode unit 12 significantly contributes to a service life of the elastic support units 13. FIGS. 3A, 3B and FIGS. 4A, 4B are views for explaining an influence of the displacement of the gravity center position of the weights 10a, 10b. FIGS. 3A, 3B are views for explaining a displacement in a vibration plane (in the xy plane of FIG. 1A) and FIGS. 4A, 4B are views for explaining a displacement in a direction perpendicular to the vibration plane (in the z-axis direction of FIG. 1B).

FIG. 3A shows a case where positioning is properly performed and FIG. 3B shows a case where positioning is improper. In FIGS. 3A, 3B, the weights 10a, 10b are not shown, but only the gravity center position of the weights 10a, 10b is indicated by a symbol G In FIGS. 3A, 3B, a line L1 is a straight line that passes through a tip of the protrusion 114a of the connection unit 114 and is parallel to the vibration direction (the x-axis direction). In the example shown in FIG. 3A, the gravity center position G of the weights 10a, 10b in the xy plane is located on the line L1.

A direction of a force F1 acting on the gravity center of the weights 10a, 10b due to vibration is therefore a direction along the line L1. When the movable electrode unit 12 collides against the protrusion 114a of the connection unit 114, a reaction force F2 acts on the movable electrode unit 12 from the protrusion 114a. The force F1 and the force F2 are opposite to each other, but directions of both forces are along the line L1. As a result, a moment that tilts the movable electrode unit 12 in the xy plane does not occur.

Note that the movable electrode unit 12 is provided with groups of movable comb teeth, which are located in the y-axis positive direction and the y-axis negative direction line-symmetrically with respect to the line L1, and the masses of the movable electrode groups are also line-symmetrical with respect to the line L1. Therefore, the line L1 can also be defined as a reference line, with respect to which the movable electrode groups of the movable electrode unit 12 are line-symmetrical with each other.

On the other hand, when the positioning shown in FIG. 3B is improper, the gravity center position G of the weights 10a, 10b is displaced in the y-axis negative direction with respect to the line L1. For this reason, when the movable electrode unit 12 collides against the protrusion 114a of the connection unit 114, vectors representing the force F1 and the force F2 are not along the same line, so that a moment acts on the movable electrode unit 12 to cause it to tilt as indicated by an arrow. Thus, the movable electrode unit 12 tilts in the xy plane. As a result, an unintentional deformation of the beam 13b occurs and causes damage to the beam 13b.

FIG. 4, which illustrates a displacement in a direction perpendicular to the vibration plane, shows an xz cross section along the line L1 in FIG. 3A. FIGS. 4A, 4B are views showing a state at the time of collision. FIG. 4A shows a case where a gravity center position G of a total mass of the weights 10a, 10b is located on the line L1 and FIG. 4B shows a case where the gravity center position G is located below the line L1 (on the z-axis negative direction side) in the figure.

When the weights 10a, 10b are made of the same material and have the same shape, their gravity center positions G1, G2 have the same height from the movable electrode unit 12. Therefore, even when a displacement of the gravity center positions G1, G2 in the xy plane occurs, the gravity center position G of the total mass of the weights 10a, 10b is located in the xy plane which includes the line L1. Therefore, no moment occurs when the movable electrode unit 12 collides against the protrusion 114a of the connection unit 114.

However, when the gravity center position G of the total mass is displaced in the z-axis direction with respect to the line L1 as shown in FIG. 4B because of different shapes of the weights 10a, 10b, for example, a moment that tilts the movable electrode unit 12 as indicated by an arrow occurs when the movable electrode unit 12 collides against the protrusion 114a of the connection unit 114 even if positioning of the weights 10a, 10b in the x direction and the y direction with respect to the movable electrode unit 12 is proper. Consequently, an unintentional deformation of the beam 13b occurs.

Figure 5:
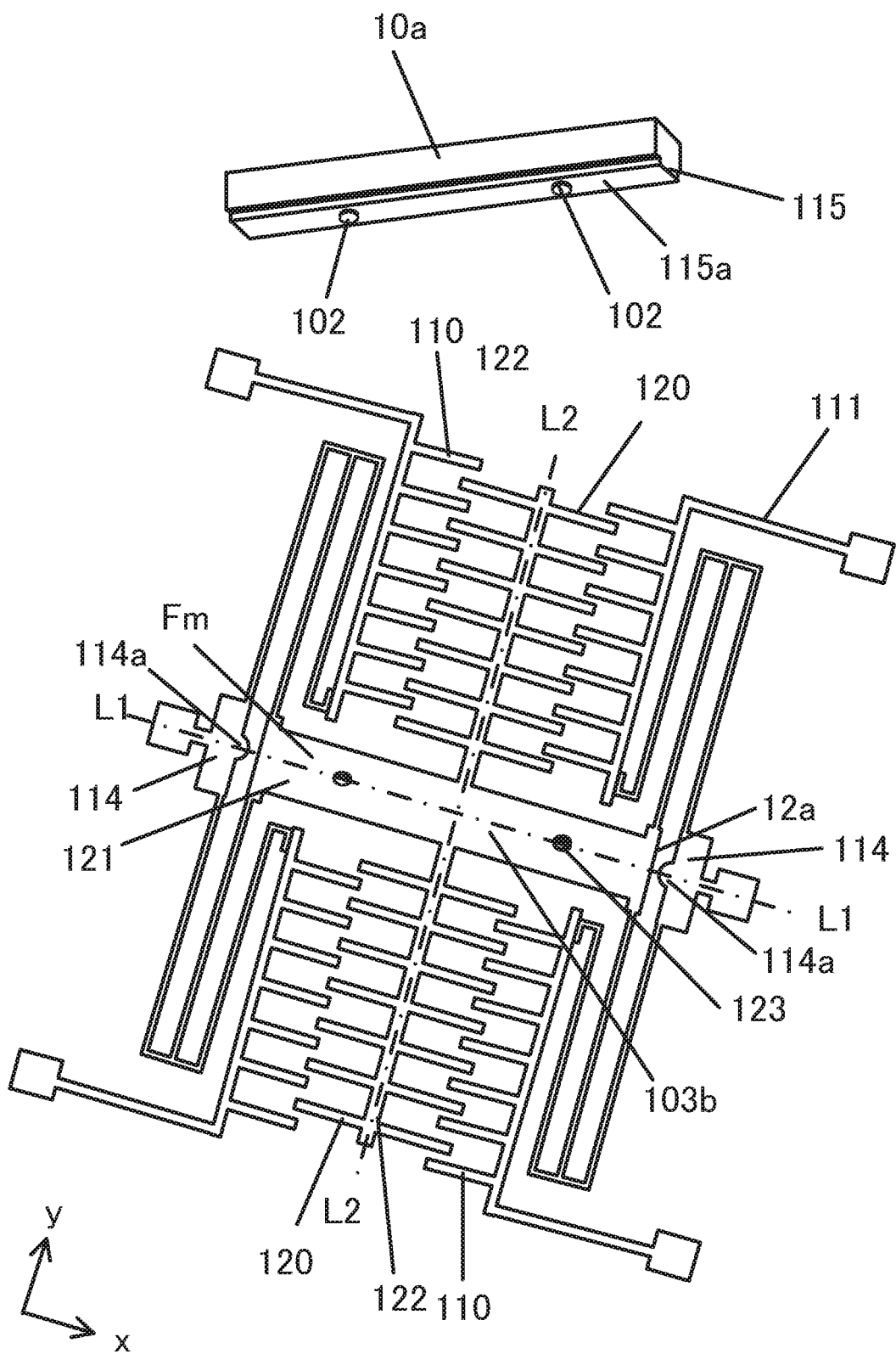
FIG. 5 shows a first embodiment illustrating a joint structure of a movable electrode unit and a weight.
Figure 6:
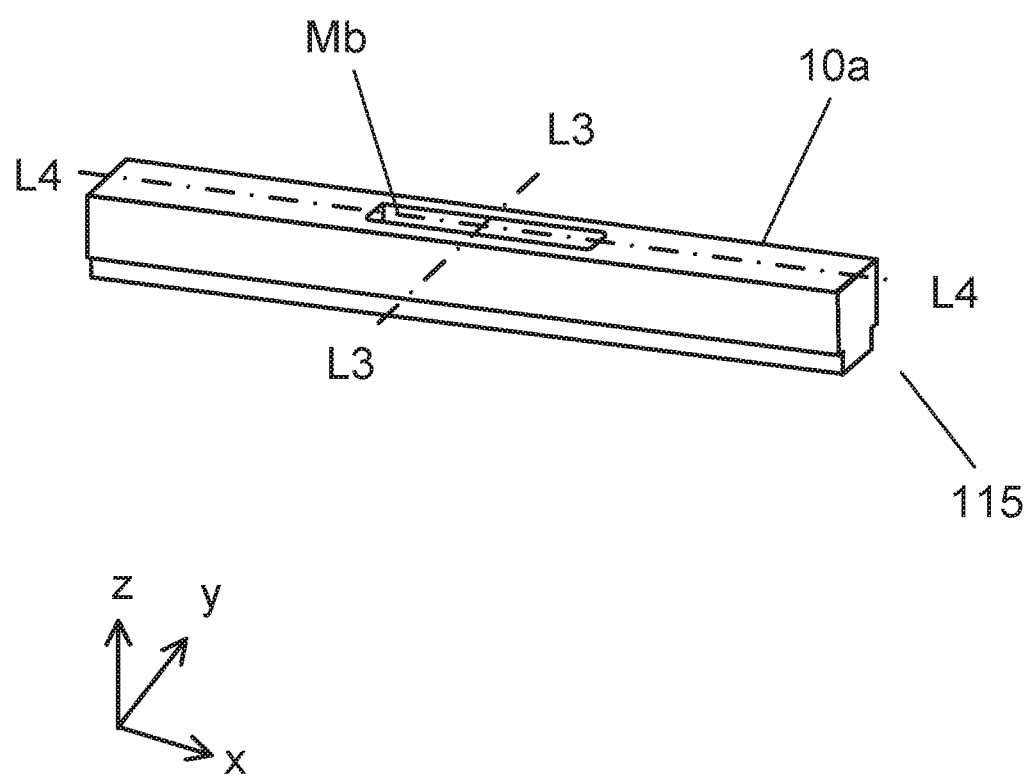
FIG. 6 is a perspective view of the weight shown in FIG. 5 as viewed from above.
Figure 7:
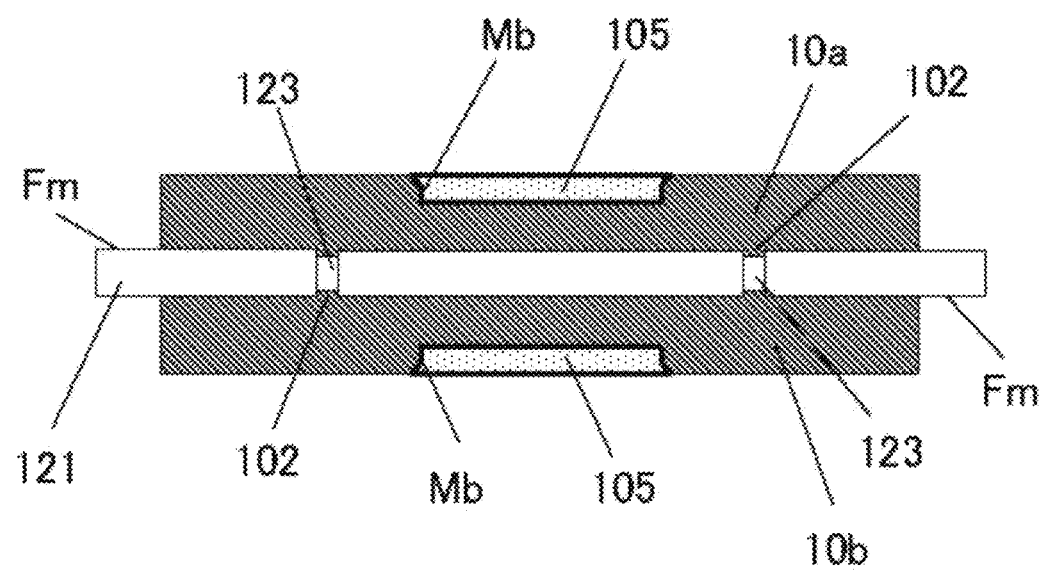
FIG. 7 is a cross-sectional view showing the joint structure of the movable electrode unit and the weight shown in FIG. 6.

FIG. 5 shows a first embodiment illustrating a joint structure of the movable electrode unit and a weight. FIG. 5 is an exploded view of the movable electrode unit and the weight shown in FIGS. 1A and 1B. FIG. 5 shows the movable electrode unit as viewed from above and the weight as viewed from below in a perspective view. FIG. 6 is a perspective view of the weight shown in FIG. 5 as viewed from above, and FIG. 7 is a cross-sectional view showing the joint structure of the movable electrode unit and the weights shown in FIGS. 1A and 1B.

The weight 10a and the weight 10b have the same shape. In the following, the weight 10a will be representatively described below.

The weight 10a has a strip-like shape extending in the x-axis direction along the central strip portion 121 of the movable electrode unit 12. A narrow width portion 115 having a small length (width) in the y-axis direction is formed in the weight 10a on a side of the central strip portion 121 of the movable electrode unit 12. A pair of positioning protrusions 102 are formed on one surface 115a of the narrow width portion 115 facing the movable electrode unit 12. In FIG. 5, the positioning protrusions 102 are illustrated to have a cylindrical shape; however, the positioning protrusions 102 may have a prismatic shape. Alternatively, the positioning protrusions 102 may have a cone shape or a pyramid shape.

As shown in FIG. 6, an adjusting weight mounting structure Mb is provided in an upper surface side (z-axis positive direction side) of the weight 10a. The adjusting weight mounting structure Mb is formed as a recess having a rectangular cross-sectional shape that is recessed downward (toward the z-axis negative direction side) from the other surface 115b opposite to the one surface 115a of the weight 10a. As shown in FIG. 7, an adjusting weight 105 is accommodated in the adjusting weight mounting structure Mb. The one surface 115a of the weight 10a is placed and fixed on a weight fixing surface Fm (see FIG. 7) which is an upper surface of the movable electrode unit 12.

A line denoted by reference numeral L2 in FIG. 5 is a center line that passes through the gravity center of the movable electrode unit 12 and is parallel to the y axis. The weight 10a is fixed to the movable electrode unit 12 so that a center line L3 passing through the center of the weight 10a in the x-axis direction is included in the yz plane which includes the center line L2.

Further, the weight 10a is fixed to the movable electrode unit 12 so that a center line L4 passing through the center of the weight 10a in the y-axis direction is included in the xz plane which includes the center line L1.

The gravity center position of the weight 10a is located on an axis that passes through an intersection of the center line L3 and the center line L4 and is parallel to the z axis. The gravity center position of the movable electrode unit 12 is located at an intersection of the line L1 and the center line L2. Thus, the gravity center position of the weight 10a is located on an axis that passes through the gravity center position of the movable electrode unit 12 and is parallel to the z axis. The adjusting weight mounting structure Mb is formed line-symmetrically with respect to the center line L3 and the center line L4. A bottom surface of the adjusting weight mounting structure Mb (that is, the recess) is provided in parallel with the weight fixing surface Fm which is the upper surface of the movable electrode unit 12 to which the weight 10a is fixed. The positioning protrusions 102 forming a pair have the same shape, and a center position of positioning protrusions 102 in a plane parallel to the xy plane is arranged at the intersection of the center line L3 and the center line L4. Therefore, the center position of the adjusting weight mounting structure Mb in the plane parallel to the xy plane is located on the same axis as the gravity center position of each of the weight 10a and the movable electrode unit 12 in the xy plane.

The same applies to the weight 10b. That is, the center position of the adjusting weight mounting structure Mb in the plane parallel to the xy plane is located on the same axis as the gravity center positions of the weights 10a, 10b and the movable electrode unit 12 in the xy plane. In other words, the center position of the adjusting weight mounting structure Mb in the plane parallel to the weight fixing surface Fm is located on the same axis as the gravity center position of each of the weights 10a, 10b and the movable electrode unit 12 in the plane parallel to the weight fixing surface Fm.

As shown in FIG. 5, positioning through holes 123 into which the positioning protrusions 102 are engaged are formed in the weight fixing surfaces Fm which is an upper surface or a lower surface of the central strip portion 121 of the movable electrode unit 12. Each of the weights 10a, 10b is joined to the weight fixing surface Fm of the center strip portion 121 of the movable electrode unit 12 by adhesion or the like, with the pair of positioning protrusions 102 engaged into the positioning through holes 123 of the center strip portion 121 of the movable electrode unit 12.

The adjusting weight 105 accommodated in the adjusting weight mounting structure Mb is made of a resin mixed with small substances. The small substances are made of preferably a material having a specific gravity higher than that of the material of the movable electrode unit 12. As an example, a material similar to the material of the weights 10a, 10b described above can be used.

Tolerances during molding with a mold or during machining such as cutting, and variations of ambient environments and set reference positions from one lot to another cause the weights 10a, 10b to be varied. This also leads to variations of the masses. If the mass of the movable electrode unit 12 varies due to variations in the masses of the weights 10a, 10b, a resonance frequency varies.

In this embodiment, after the weight 10a or the weight 10b is made, the adjusting weight 105 is inserted into the adjusting weight mounting structure Mb formed in the weight 10a, 10b by using a dispenser or the like, so that the masses of the weights 10a, 10b can be finely adjusted.

When the weight fixing surface Fm for the weights 10a, 10b is arranged horizontally, the adjusting weight 105 made of resin is applied in the recess, which is the adjusting weight mounting structure Mb, with an uniform thickness. As described above, the center position of the adjusting weight mounting structure Mb in the plane parallel to the xy plane is located on the same axis as the gravity center position of each of the weights 10a, 10b and the movable electrode unit 12 in the xy plane. The adjusting weight mounting structure Mb is formed line-symmetrically with respect to the center line L3 in the x-axis direction and the center line L4 in the y-axis direction.

Therefore, according to this embodiment, the masses of the weights 10a, 10b can be easily set within a predetermined set value range without changing the gravity center positions of the weights 10a, 10b.

FIGS. 8A to 8D and FIGS. 9A to 9D are views illustrating an example of a procedure for forming the MEMS processed member of the vibration energy harvester 1. A method of forming a vibration energy harvester from a SOI substrate by a MEMS processing technique is well-known (see, for example, Japanese Laid-Open Patent Publication No. 2017-070163). Herein, an outline of the formation procedure will be described. Note that FIGS. 8A to 8D and FIGS. 9A to 9D schematically show cross-sections taken along the dashed-dotted line C-C in FIG. 2A.

Figure 8A:
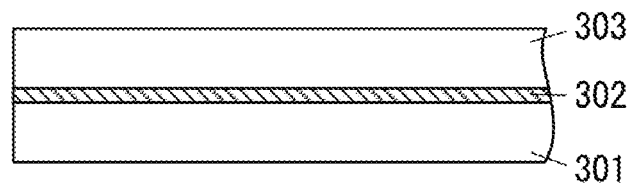
FIGS. 8A to 8D are views illustrating an example of a procedure for forming a MEMS processed member of the vibration energy harvester.
Figure 8B:
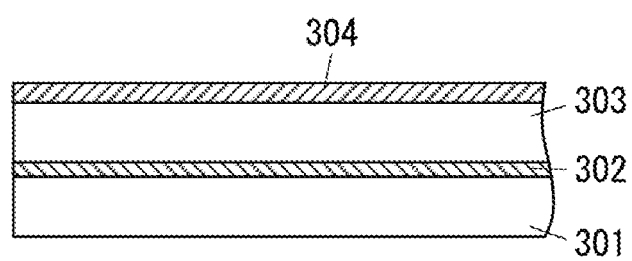
Figure 8C:
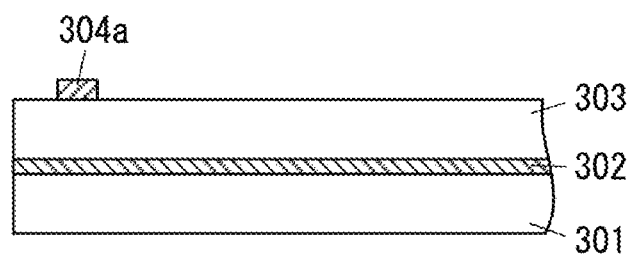

FIG. 8A is a view showing a cross section of a SOI substrate which is a substrate to be subjected to MEMS processing. As described above, the SOI substrate includes a Si support layer 301, a $SiO_2$ box layer 302, and a Si active layer 303. In a first step shown in FIG. 8B, a nitride film (SiN film) 304 is formed on a surface of the active layer 303. In a second step shown in FIG. 8C, the nitride film 304 is patterned to form a nitride film pattern 304a for protecting portions where the electrode pads 112, 113 are to be formed.

Figure 8D:
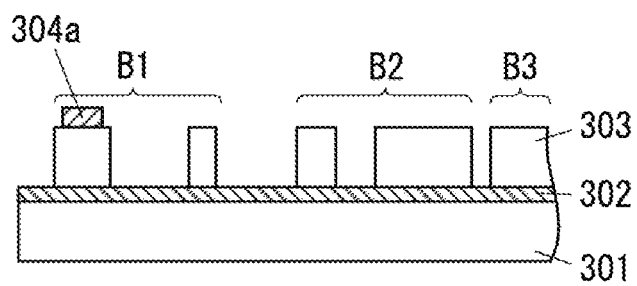

In a third step shown in FIG. 8D, a mask pattern for forming a movable electrode unit 12, fixed electrode units 111, elastic support units 13, and connection units 114 is formed, and the active layer 303 is etched. The etching process is performed by DRIE (Deep Reactive Ion Etching) or the like until the box layer 302 is reached. In FIG. 8D, a portion denoted by reference numeral B1 corresponds to the fixed electrode units 111, a portion denoted by reference numeral B2 corresponds to the movable electrode part 12, and a portion denoted by reference numeral B3 corresponds to the connection units 114.

Figure 9A:
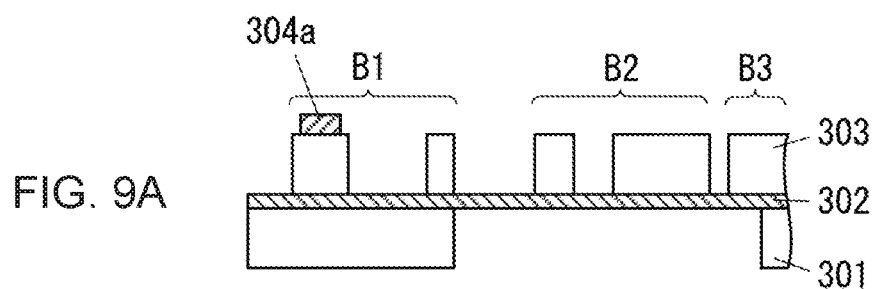
FIGS. 9A to 9D are views illustrating a procedure for forming the MEMS processed member following the procedure in FIGS. 8A to 8D.
Figure 9B:
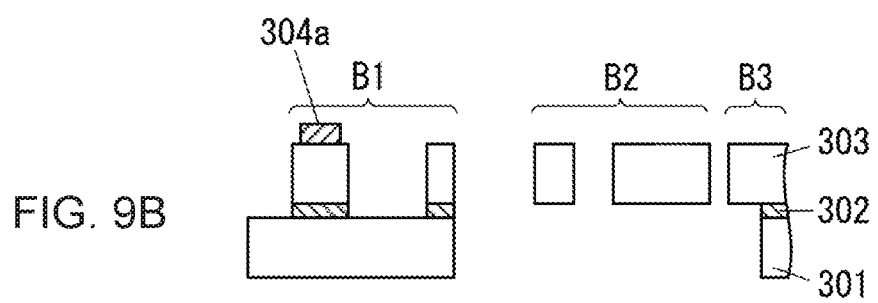
Figure 9C:
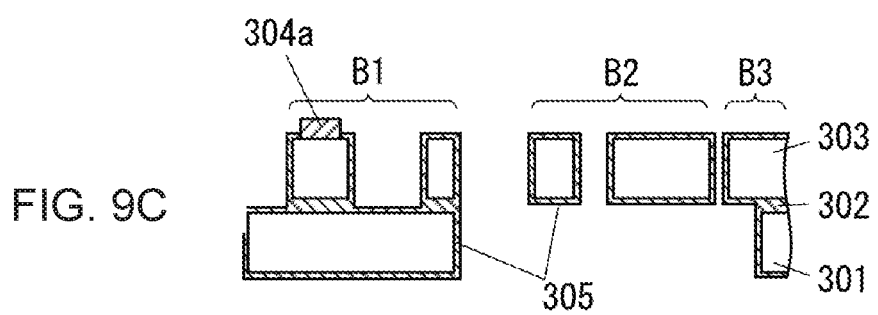
Figure 9D:
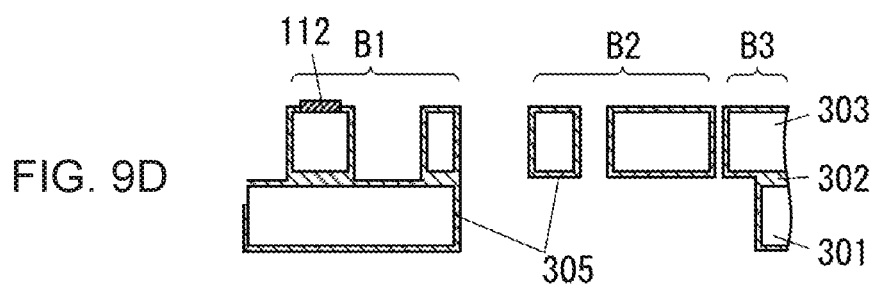

In a fourth step shown in FIG. 9A, a mask pattern for forming the fixed unit 11 is formed on a surface of the support layer 301, and the support layer 301 is subjected to DRIE processing. In a fifth step shown in FIG. 9B, the $SiO_2$ BOX layer exposed on the support layer 301 side and the active layer 303 side is removed with strong hydrofluoric acid. In a sixth step shown in FIG. 9C, a silicon oxide film 305 is formed on a surface of the Si layer by thermal oxidation. In a seventh step shown in FIG. 9D, the nitride film pattern 304a is removed, and an aluminum electrode is formed in the removed region to form electrode pads 112, 113. Note that the electrode pad 113 is not shown in FIG. 9D because it is formed outside of the range shown in FIG. 9D.

By the above-described processing procedure, the MEMS processed member of the vibration energy harvester 1 having no electret is formed. Then, an electret is formed in at least one side of the comb-tooth electrodes 110, 120 by a known electret formation method (for example, refer to Japanese Patent No. 5627130).

The vibration energy harvester 1 is an extremely small structure processed by the MEMS technique, and vertical and horizontal dimensions of the package 2 shown in FIGS. 1A, 1B are on the order of several centimeters and a height dimension of the package 2 is on the order of several millimeters.

According to the above-described embodiment, the following effects can be achieved.

(1) A vibration energy harvester 1 includes a fixed electrode unit 111 having a plurality of comb-tooth electrodes 110; a movable electrode unit 12 having a plurality of comb-tooth electrodes 120; a weight 10a, 10b fixed to the movable electrode unit 12; and an adjusting weight mounting structure Mb capable of mounting an adjusting weight 105 for additionally adjusting a mass of the weight. Therefore, after the weight 10a or the weight 10b is made, the adjusting weights 105 are inserted into the adjusting weight mounting structures Mb formed in the weights 10a, 10b to finely adjust the masses of the weights 10a, 10b, so that the masses of the weights 10a, 10b can be easily set within a predetermined set value range.

(2) The adjusting weight 105 is made of a resin mixed with small substances. The masses of the weights 10a, 10b can thus be easily set within a predetermined set value range without changing the gravity center position.

(3) In the adjusting weight 105, small substances having a large specific gravity such as a metal is mixed. The masses can thus be finely adjusted, even when the masses at the time of making the weights 10a, 10b are small.

(4) The weights 10a, 10b are made of a material having a specific gravity larger than that of the material of the movable electrode unit 12. The weights 10a, 10b can thus be reduced in size, which achieves a size reduction in the vibration energy harvester 1.

In the first embodiment described above, the weights 10a, 10b are illustrated to have a strip-like shape corresponding to the shape of the center strip portion 121 of the movable electrode part 12. However, the weights 10a, 10b may be configured as follows.

First Modification of Weight

FIGS. 10A to 10C show a first modification of the weight. FIG. 10A is a plan view of the weight, FIG. 10B is a cross-sectional view taken along a center line L6-L6 of FIG. 10A, and FIG. 10C is a cross-sectional view taken along a center line L5-L5 of FIG. 10A.

A weight 10c shown in FIGS. 10A to 10C has a structure in which a strip-like portion 161 and a plate-like portion 162 are integrally molded. The strip-like portion 161 has a shape corresponding to the weights 10a, 10b in the first embodiment, and is joined to the central strip portion 121 of the movable electrode unit 12. The plate-like portion 162 has a rectangular shape in plan view and has an area larger than that of the strip-like portion 161. The plate-like portion 162 has a size that covers all or a part of the comb-tooth electrode 110 of the fixed electrode unit 111 and the comb-tooth electrode 120 of the movable electrode unit 12.

A center line passing through the center of the plate-like portion 162 in the x-axis direction coincides with a center line passing through the center of the strip-like portion 161 in the x-axis direction, in the xy plane. That is, the center line passing through the center of the strip-like portion 161 and the plate-like portion 162 in the x-axis direction coincides with the center line L5 of the weight 10c in the x-axis direction. Further, a center line passing through the center of the plate-like portion 162 in the y-axis direction coincides with a center line passing through the center of the strip-like portion 161 in the y-axis direction, in the xy plane. A center line passing through the center of the strip-like portion 161 and the plate-like portion 162 in the y-axis direction coincides with a center line passing through the center of the weight 10 in the y-axis direction. The weight 10c is fixed to the movable electrode unit 12 so that the center line L6 passing through the center of the weight 10c in the y-axis direction and the line L1 which is a straight line passing through the protrusions 114a of the connection units 114 and being parallel to the vibration direction (x-axis direction) are at the same position in the xy plane.

A pair of positioning protrusions 102 are formed on the strip-like portion 161 of the weight 10c, and an adjusting weight mounting structure Mb is formed on the plate-like portion 162 of the weight 10c. A center of the pair of positioning protrusions 102 and a center of the adjusting weight mounting structure Mb are located on the center line L6. The positioning protrusions 102 forming a pair are arranged at symmetrical positions with respect to the center line L5 of the weight 10c. The shape of the adjusting weight mounting structure Mb is line-symmetrical with respect to the center line L5 of the weight 10c and the center line L6 of the weight 10c. Therefore, the center position of the adjusting weight mounting structure Mb in a plane parallel to the xy plane is located on the same axis as the gravity center positions of the weight 10c and the movable electrode unit 12 in the xy plane.

The plate-like portion 162 of the weight 10c is illustrated to have a rectangular shape in plan view in FIG. 10A. However, the weight 10c may have another polygonal shape as long as it is symmetrical with respect to each of the center line L5 and the center line L6.

Second Modification of Weight

Figures 11A, 11C:
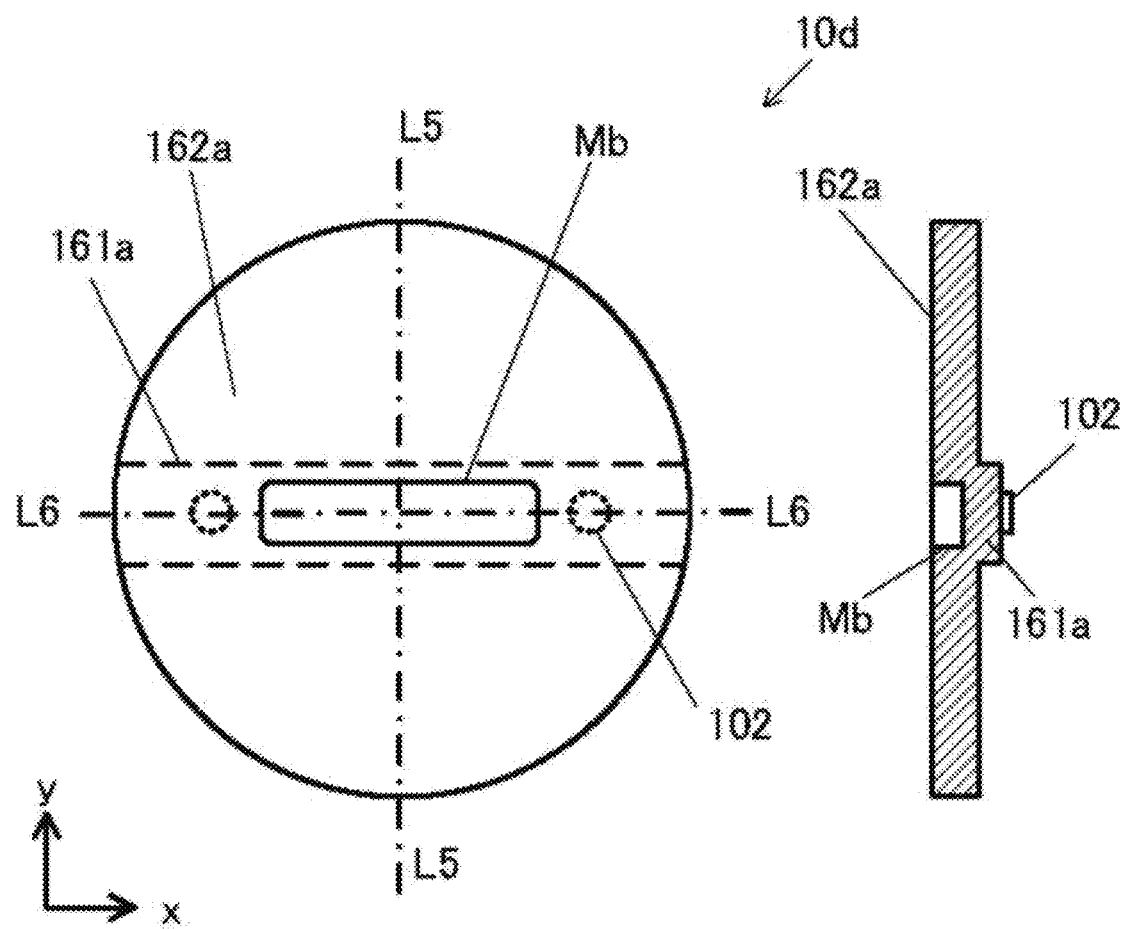
FIGS. 11A to 11C show a second modification of the weight.
Figure 11B:
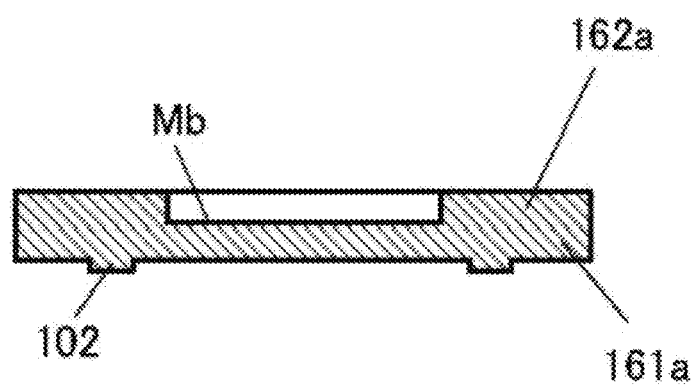

FIGS. 11A to 11C show a second modification of the weight. FIG. 11A is a plan view of the weight, FIG. 11B is a cross-sectional view taken along a center line L6-L6 of FIG. 11A, and FIG. 11C is a cross-sectional view taken along a center line L5-L5 of FIG. 11A.

A weight 10d shown in FIGS. 11A to 11C has a structure in which a strip-like portion 161 and a plate-like portion 162 are integrally molded. The strip-like portion 161a has a shape corresponding to the weights 10a, 10b in the first embodiment, and is joined to the central strip portion 121 of the movable electrode unit 12. The plate-like portion 162a has a circular shape in plan view and has an area larger than that of the strip-like portion 161a. The plate-like portion 162a has a size that covers all or a part of the comb-tooth electrode 110 of the fixed electrode unit 111 and the comb-tooth electrode 120 of the movable electrode unit 12.

The center of the plate-like portion 162 coincides with a center of the strip-like portion 161a in the xy plane. That is, the centers of the strip-like portion 161a and the plate-like portion 162a coincide with the center of the weight 10d. A center line L6 passing through the center of the weight 10d in the y-axis direction is located in the xy plane at the same position as the line L1 which is a straight line passing through the protrusions 114a of the connection units 114 and being parallel to the vibration direction (x-axis direction). Note that the center line L5 is a straight line that passes through the center of the weight 10d and is parallel to the y-axis.

A pair of positioning protrusions 102 are formed on the strip-like portion 161a of the weight 10d, and an adjusting weight mounting structure Mb is formed on the plate-like portion 162a of the weight 10d. A center of the pair of positioning protrusions 102 and a center of the adjusting weight mounting structure Mb are located on the center line L6. The positioning protrusions 102 forming a pair are arranged at symmetrical positions with respect to the center line L5 of the weight 10d. Further, the shape of the adjusting weight mounting structure Mb is line-symmetrical with respect to the center line L5 and the center line L6 of the weight 10d. Therefore, the center position of the adjusting weight mounting structure Mb in the plane parallel to the xy plane is located on the same axis as the gravity center position of each of the weight 10d and the movable electrode unit 12 in the xy plane.

Third Modification of Weight

Figures 12A, 12C:
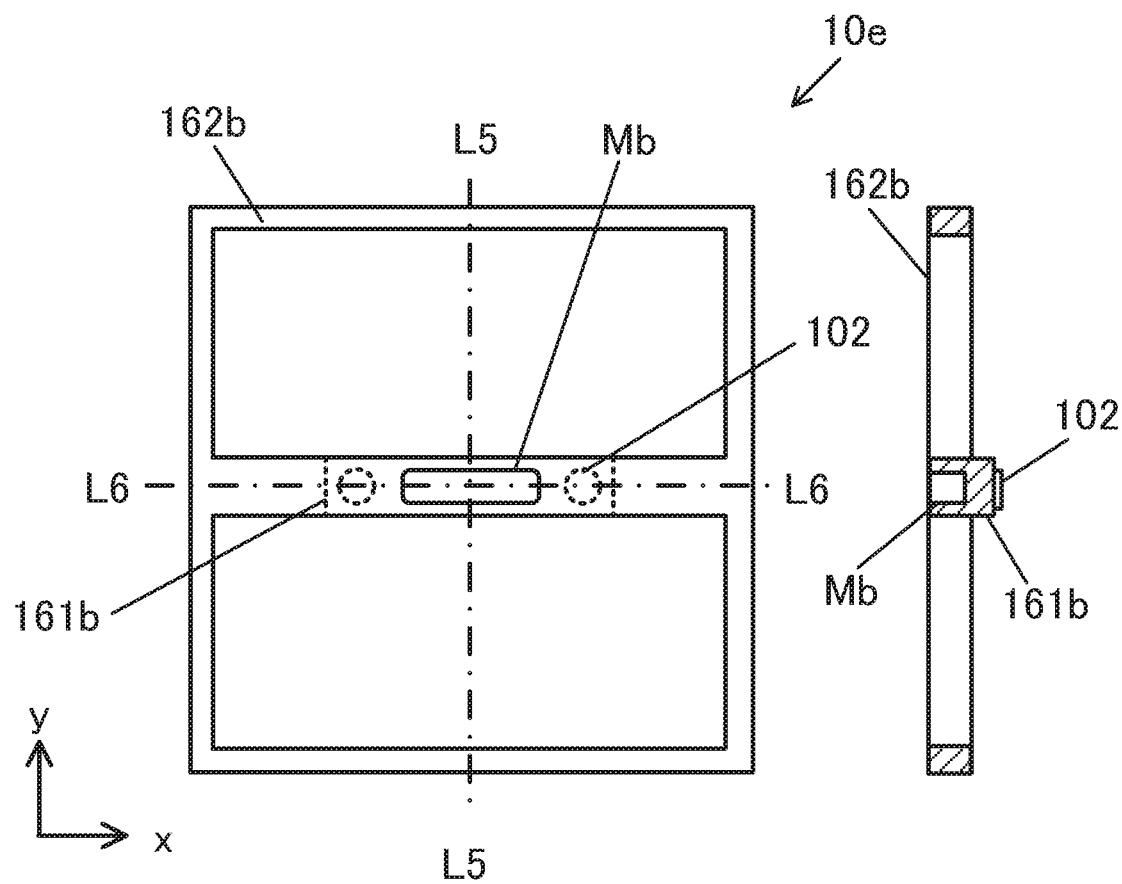
FIGS. 12A to 12C show a third modification of the weight.
Figure 12B:
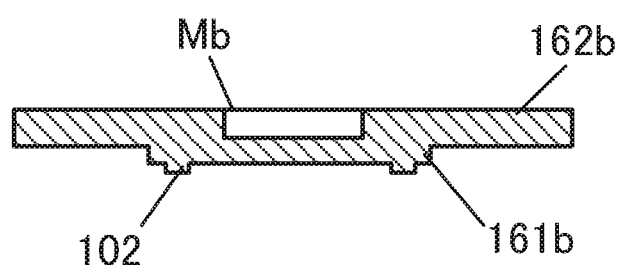

FIGS. 12A to 12C show a third modification of the weight. FIG. 12A is a plan view of the weight, FIG. 12B is a cross-sectional view taken along a center line L6-L6 of FIG. 12A, and FIG. 12C is a cross-sectional view taken along a center line L5-L5 of FIG. 12A.

A weight 10e shown in FIGS. 12A to 12C has a structure in which a strip-like portion 161b and a plate-like portion 162b are integrally molded. The strip-like portion 161b has a shape corresponding to the weights 10a, 10b in the first embodiment, and is joined to the central strip portion 121 of the movable electrode unit 12. The plate-like portion 162b has a rectangular frame shape in plan view and has an area larger than that of the strip-like portion 161b. The plate-like portion 162b has a size that covers all or a part of the comb-tooth electrode 110 of the fixed electrode unit 111 and the comb-tooth electrode 120 of the movable electrode unit 12.

A center line passing through the center of the plate-like portion 162b in the x-axis direction coincides with a center line passing through the center of the strip-like portion 161b in the x-axis direction in the xy plane. That is, the center line passing through the center of the strip-like portion 161b and the plate-like portion 162b in the x-axis direction coincides with the center line L5 passing through the center of the weight 10e in the x-axis direction. Further, a center line passing through the center of the plate-like portion 162b in the y-axis direction coincides with a center line passing through the center of the strip-like portion 161b in the y-axis direction, in the xy plane. That is, the center line passing through the center of the strip-like portion 161b and the plate-like portion 162b in the y-axis direction coincides with the center line L6 passing through the center of the weight 10e in the y-axis direction. A center line L6 is located in the xy plane at the same position as the line L1 which is a straight line passing through the protrusion 114a of the connection unit 114 and being parallel to the vibration direction (x-axis direction).

A pair of positioning protrusions 102 are formed on the strip-like portion 161b of the weight 10e, and an adjusting weight mounting structure Mb is formed on the plate-like portion 162b of the weight 10e. A center of the pair of positioning protrusions 102 and a center of the adjusting weight mounting structure Mb are located on the center line L6. The positioning protrusions 102 forming a pair are arranged at symmetrical positions with respect to the center line L5 passing through the center of the weight 10e in the x-axis direction. Further, the shape of the adjusting weight mounting structure Mb is line-symmetrical with respect to the center line L5 passing through the center of the weight 10e in the x-axis direction and the center line L6 passing through the center of the weight 10e in the y-axis direction. Therefore, the center position of the adjusting weight mounting structure Mb in the plane parallel to the xy plane is located on the same axis as the gravity center position of each of the weight 10e and the movable electrode unit 12 in the xy plane.

The weights 10c to 10e illustrated as first to third modifications of the weights 10a, 10b are mounted on the movable electrode unit 12 of the MEMS processed member shown in the first embodiment. Therefore, the vibration energy harvester 1 including any of the weights 10c to 10e achieves the effects (1) to (4) of the first embodiment.

Further, the weights 10c to 10e illustrated as the first to third modifications of the weights 10a, 10b have a structure in which the strip-like portions 161, 161a, and 161b and the plate-like portions 162, 162a, and 162b are integrally provided. Therefore, the masses of the weights 10c to 10e can be larger than those of the weights 10a, 10b, so that the electric power generation efficiency of the vibration energy harvester 1 can be further improved.

Second Embodiment

Figure 14:
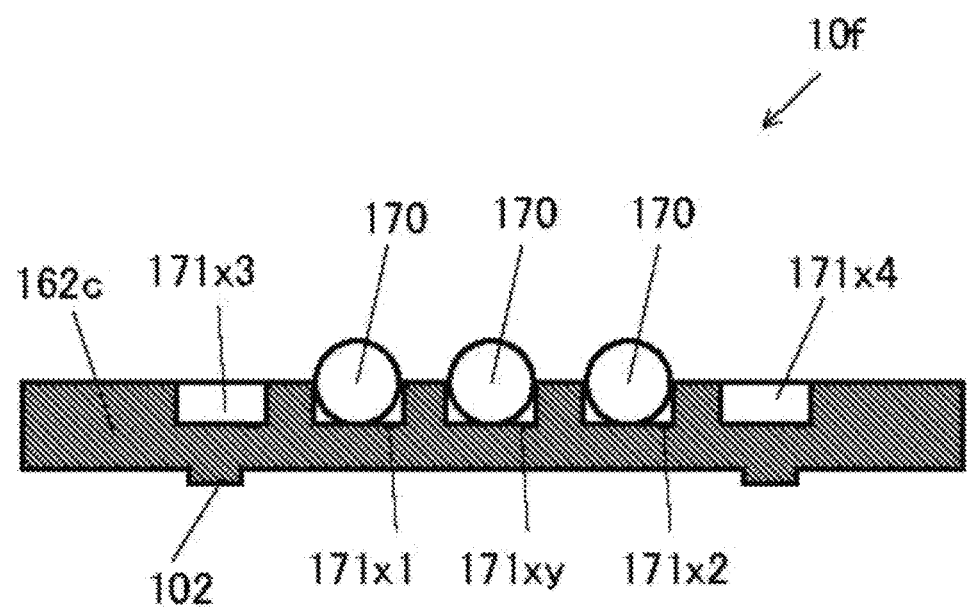
FIG. 14 is a cross-sectional view taken along the center line L6-L6 of FIG. 13A, showing a state in which an adjusting weight is mounted on the weight.

FIGS. 13A to 13C show a second modification of the weight. FIG. 13A is a plan view of the weight, FIG. 13B is a cross-sectional view taken along a center line L6-L6 of FIG. 13A, and FIG. 13C is a cross-sectional view taken along a center line L5-L5 of FIG. 13A. Further, FIG. 14 is a cross-sectional view taken along the center line L6-L6 in FIG. 13A, showing a state in which an adjusting weight is mounted on the weight.

A weight 10f of the second embodiment has a structure in which a strip-like portion 161c and a plate-like portion 162c are integrally molded. The strip-like portion 161c has a shape corresponding to the weights 10a, 10b in the first embodiment, and is joined to the central strip portion 121 of the movable electrode unit 12. The plate-like portion 162c has a rectangular shape in plan view and has an area larger than that of the strip-like portion 161c. The plate-like portion 162c has a size that covers a part of the comb-tooth electrode 110 of the fixed electrode unit 111 and the comb-tooth electrode 120 of the movable electrode unit 12.

A center line passing through the center of the plate-like portion 162c in the x-axis direction coincides with a center line passing through the center of the strip-like portion 161c in the x-axis direction in the xy plane. That is, the center line passing through the center of the strip-like portion 161c and the plate-like portion 162c in the x-axis direction coincides with the center line L5 passing through the center of the weight 10f in the x-axis direction. Further, a center line passing through the center of the plate-like portion 162c in the y-axis direction coincides with a center line passing through the center of the strip-like portion 161c in the y-axis direction, in the xy plane. That is, the center line passing through the center of the strip-like portion 161c and the plate-like portion 162c in the y-axis direction coincides with the center line L6 passing through the center of the weight 10f in the y-axis direction. A center line L6 passing through the center of the weight 10f in the y-axis direction is located in the xy plane at the same position as the line L1 which is a straight line passing through the protrusion 114a of the connection unit 114 and being parallel to the vibration direction (x-axis direction).

A pair of positioning protrusions 102 are formed on the strip-like portion 161c of the weight 10f. An adjusting weight mounting structure Mb is formed on the plate-like portion 162c of the weight 10f. The adjusting weight mounting structure Mb in the second embodiment includes a plurality of recesses 171. That is, the adjusting weight mounting structure Mb includes a plurality of divided adjusting weight mounting structures. In FIGS. 13A to 13C, the adjusting weight mounting structure Mb includes recesses 171xy, 171x1 to 171x4 arranged at equal intervals on the center line L6 and recesses 171xy, 171y1 to 171y4 arranged at equal intervals on a center line L5. The recess 171xy is provided at an intersection of the center line L5 and the center line L6, and the adjusting weight mounting structure Mb illustrated in FIGS. 13A to 13C includes nine recesses 171. Note that the recesses 171x1 to 171x4, 171xy, and 171y1 to 171y4 are collectively referred to as recesses 171. As will be described later, an adjusting weight 170 (see FIG. 14) is accommodated in each recess 171. As the adjusting weight 170, for example, a small spherical piece of metal or the like can be used.

The recesses 171x1 and 171x2 as well as the recesses 171x3 and 171x4, which are arranged on the center line L6, are arranged line-symmetrically with respect to the center line L5. That is, the recesses 171x1 to 171x4, which are a plurality of divided adjusting weight mounting structures, pass through the gravity center of the weight 10f in a plane parallel to the weight fixing surface Fm (see FIG. 5) to which the weight 10f of the movable electrode unit 12 is fixed. Further, the recesses 171x1 to 171x4 are arranged line-symmetrically with respect to a straight line in a direction orthogonal to a direction in which the comb-tooth electrodes 120 of the movable electrode 12 vibrate, in other words, with respect to the center line L5. Further, the recesses 171y1 and 171y2 as well as the recesses 171y3 and 171y4, which are arranged on the center line L5, are arranged line-symmetrically with respect to the center line L6. That is, the recesses 171y1 to 171y4, which are a plurality of divided adjusting weight mounting structures, pass through the gravity center of the weight 10f in a plane parallel to the weight fixing surface Fm to which the weight 10f of the movable electrode unit 12 is fixed. Further, the recesses 171y1 to 171y4 are arranged line-symmetrically with respect to a straight line in a direction parallel to a direction in which the comb-tooth electrodes 120 of the movable electrode 12 vibrate, in other words, with respect to the center line L6. The recesses 171 respectively have the same shape and size.

The intersection of the center line L5 and the center line L6 is the gravity center position of the weight 10f in the xy plane, and is located on the same axis as the gravity center position of the movable electrode unit 12 in the xy plane.

Therefore, the center position of the adjusting weight mounting structure Mb in a plane parallel to the weight fixing surface Fm is located on the same axis as the gravity center positions of the weight 10f and the movable electrode unit 12 in the weight fixing surface Fm.

A procedure for adjusting the mass of the weight 10f will be described with reference to FIG. 14. When the mass of the weight 10f is insufficient, the adjusting weight 170 is first accommodated in the recess 171xy. If the mass of the weight 10f is still insufficient even when the adjusting weight 170 is accommodated in the recess 171xy, adjusting weights 170 are accommodated in the recess 171x1 and in the recess 171x2. The adjusting weights 170 accommodated in the recess 171x1 and in the recess 171x2 have the same mass. This allows the mass of the weight 10f to be increased without changing the gravity center position of the weight 10f in the xy plane. If the mass of the weight 10f is still insufficient even when the adjusting weight 170 is accommodated in the recess 171x1 and in the recess 171x2, adjusting weights 170 are accommodated in the recess 171x3 and in the recess 171x4. The adjusting weights 170 accommodated in the recess 171x3 and in the recess 171x4 have the same mass. This allows the mass of the weight 10f to be increased without changing the gravity center position of the weight 10f in the xy plane.

Accommodation of the adjusting weights 170 in the recesses 171y1 to 171y4 arranged on the center line L5 in the x-axis direction is performed in the same manner as the accommodation of the adjusting weights 170 in the recesses 171x1 to 171x4 arranged on the center line L6 in the y-axis direction. That is, if the mass of the weight 10f is still insufficient even when the adjusting weight 170 is accommodated in the recess 171xy, adjusting weights 170 are accommodated in the recess 171y1 and in the recess 171y2. If the mass of the weight 10f is still further insufficient, adjusting weights 170 are accommodated in the recess 171y3 and in the recess 171y4.

The accommodation of the adjusting weights 170 in the recesses 171y1 to 171y4 may be preformed after the accommodation of the adjusting weights 170 in all the recesses 171x1 to 171x4, or the accommodation of the adjusting weights 170 in the recesses 171x1 to 171x4 arranged on the center line L6 and the accommodation of the adjusting weights 170 in the recesses 171x1 to 171x4 arranged on the center line L5 may be alternately performed.

The weights 170 accommodated in the recesses 171 may all have the same mass or may have different masses. In a case where the adjusting weights 170 accommodated in the recesses 171 have different masses, the adjusting weight 170 having a large mass can be used when the mass of the weight 10f is significantly insufficient and the adjusting weights 170 having smaller masses can be used as the mass of the weight 10f is less insufficient. This allows the mass of the weight 10f to be efficiently adjusted.

Even when the adjusting weights 170 accommodated in the recesses 171 have different masses, the adjusting weights 170 having the same mass are accommodated in the recesses 171 at line-symmetrical positions. That is, the adjusting weights 170 accommodated in the recesses 171x1 and 171x2, the recesses 171x3 and 171x4, the recesses 171y1 and 171y2, and the recesses 171y3 and 171y4 have the same mass. This allows the mass of the weight 10f to be increased without changing the position of the gravity center of the weight 10f in the xy plane.

The adjusting weight 170 may be made of resin, instead of the small piece of metal or the like. A resin mixed with small substances is preferable, as in the first embodiment. Moreover, both small pieces of metal or the like and resin may be used. For example, a small piece of metal or the like is used when the mass of the weight 10f is significantly insufficient, whereas a resin is inserted when the mass of the weight 10f is slightly insufficient.

In FIGS. 13A to 13C, the recesses 171 are illustrated as the adjusting weight mounting structures Mb arranged on the center line L5 and on the center line L6. However, the adjusting weight mounting structure Mb may be a structure having recesses 171 arranged either on the center line L5 or on the center line L6. In FIGS. 13A to 13C, the structure having the recess 171xy provided at the intersection of the center line L5 and the center line L6 is illustrated. However, no recess 171xy may be provided at the intersection of the center line L5 and the center line L6. In this case, the recesses 171 arranged on the center line L5 are placed line-symmetrically with respect to the center line L6. Further, the recesses 171 arranged on the center line L6 are arranged line-symmetrically with respect to the center line L5.

The recesses 171 arranged on the center line L5 and on the center line L6 may not be spaced at equal intervals. However, positions of a pair of recesses 171 arranged line-symmetrically with respect to the center line L5 or the center line L6 may be set at equal distances from the symmetrical axis. That is, the recess 171x1 and the recess 171x2, and the recess 171x3 and the recess 171x4 are arranged at equal distances from the center line L5. Further, the recess 171y1 and the recess 171y2, and the recess 171y3 and the recess 171y4 are arranged at equal distances from the center line L6.

The numbers of the recesses 171 arranged on the center line L5 and on the center line L6 are not limited to five as illustrated in FIGS. 13A to 13C. The number may be more or less. Further, the numbers of the recesses 171 arranged on the center line L5 and on the center line L6 may be different.

In the above-described embodiment, the vibration energy harvester 1 is formed of the SOI substrate; however, a silicon substrate may be used. In a case of using a silicon substrate, for example, a P-type or N-type conductive layer is formed by doping from a surface of an intrinsic silicon substrate having a low conductivity into a predetermined thickness region. Then, the fixed unit 11 may be formed on an intrinsic silicon layer below the conductive layer, and the fixed electrode units 111, the movable electrode unit 12, and the elastic support units 13 may be formed on the conductive layer.

Further, in the vibration energy harvester 1 described above, the movable electrode unit 12 is configured to vibrate in a direction in which the comb-tooth electrodes 110 and 120 extend (the x-axis direction in FIG. 1A). The present invention can, however, also be applied to a configuration in which the movable electrode unit 12 vibrates in a direction in which a plurality of comb-tooth electrodes 110 are apposed or juxtaposed (the y-axis direction in FIG. 1A) as in the vibration energy harvester described in Japanese Patent 6338071A.

Although various embodiments and modifications have been described above, the present invention is not limited thereto. The above-described various embodiments and modifications may be combined or modified as appropriate, and other aspects conceivable within the scope of the technical idea of the present invention are also included in the scope of the present invention.

REFERENCE SIGNS LIST 1 vibration energy harvester
10a to 10f weight
12 movable electrode unit
13 elastic support unit
102 positioning protrusion
105 adjusting weight
110 comb-tooth electrode
111 fixed electrode unit
114 connection unit
114a protrusion
120 comb-tooth electrode
121 central strip portion
123 positioning through hole
161, 161a to 161c strip-like portion
162, 162a to 162c plate-like portion
170 adjusting weight
171, 171xy, 171x1 to 171x4, 171y1 to 171y4 recess
Fm weight fixing surface
L1 line
L2, L3, L4 center line
Mb adjusting weight mounting structure
G, G1, G2 gravity center position

The invention claimed is:

1. A vibration energy harvester comprising:
   a fixed electrode unit having a plurality of comb-tooth electrodes;
   a movable electrode unit having a plurality of comb-tooth electrodes;
   a weight fixed to the movable electrode unit; and
   an adjusting weight mounting structure capable of mounting an adjusting weight provided on the weight for additionally adjusting a mass of the weight,
   wherein
      the adjusting weight mounting structure is formed as a recess in a direction orthogonal to a direction in which the plurality of comb tooth electrodes of the movable electrode unit vibrate, and
      the adjustment weight is accommodated in the adjusting weight mounting structure.

2. The vibration energy harvester according to claim 1, wherein:
   the adjusting weight mounting structure is a recess provided in a surface opposite to a surface of the weight to which the movable electrode unit is fixed.

3. The vibration energy harvester according to claim 1, wherein:
   the weight is fixed to a weight fixing surface of the movable electrode unit; and
   a center position of the adjusting weight mounting structure in a plane parallel to the weight fixing surface is located on a same axis as a gravity center position of each of the weight and the movable electrode unit in the plane parallel to the weight fixing surface.

4. The vibration energy harvester according to claim 1, wherein:
   the adjusting weight is made of a material having a specific gravity higher than that of a material of the movable electrode unit.

5. The vibration energy harvester according to claim 1, wherein:
   the adjusting weight is made of a resin mixed with small substances.

6. The vibration energy harvester according to claim 5, wherein:
   the small substances are made of a material having a specific gravity higher than that of the material of the movable electrode unit.

7. The vibration energy harvester according to claim 1, wherein:
   the movable electrode unit has a central strip portion extending in a direction orthogonal to an arrangement direction of the comb-tooth electrodes of the movable electrode unit, in a center part in the arrangement direction of the comb-tooth electrodes of the movable electrode unit; and
   the weight has a strip-like portion extending along the central strip portion and a plate-like portion, the plate-like portion being provided integrally with the strip-like portion and covering at least a part of the comb-tooth electrodes of the fixed electrode unit and the comb-tooth electrodes of the movable electrode unit.

8. The vibration energy harvester according to claim 1, wherein:
   the adjusting weight mounting structure includes a plurality of divided adjusting weight mounting structures.

9. The vibration energy harvester according to claim 8, wherein:
   a small piece as the adjusting weight is accommodated in one of the divided adjusting weight mounting structures.

10. The vibration energy harvester according to claim 8, wherein:
    in a plane parallel to the weight fixing surface to which the weight of the movable electrode unit is fixed, the plurality of divided adjusting weight mounting structures pass through the gravity center of the weight and are arranged line-symmetrically with respect to a line in a direction orthogonal to a direction in which the comb-tooth electrodes of the movable electrode unit vibrate.

11. The vibration energy harvester according to claim 10, wherein:
    the plurality of divided adjusting weight mounting structures are arranged in an arrangement direction of the comb-tooth electrodes of the movable electrode unit and in a direction orthogonal to the arrangement direction of the comb-tooth electrodes of the movable electrode unit.

12. A vibration energy harvester comprising:
    a fixed electrode unit having a plurality of comb-tooth electrodes;
    a movable electrode unit having a plurality of comb-tooth electrodes;
    a weight fixed to the movable electrode unit; and
    an adjusting weight mounting structure capable of mounting an adjusting weight for additionally adjusting a mass of the weight,
    wherein the movable electrode unit has a central strip portion extending in a direction orthogonal to an arrangement direction of the comb-tooth electrodes of the movable electrode unit, in a center part in the arrangement direction of the comb-tooth electrodes of the movable electrode unit; and the weight has a strip-like portion extending along the central strip portion and a plate-like portion, the plate-like portion being provided integrally with the strip-like portion and covering at least a part of the comb-tooth electrodes of the fixed electrode unit and the comb-tooth electrodes of the movable electrode unit.

* * * * *